US 6,639,457 B1

(12) United States Patent
Lou

(10) Patent No.: US 6,639,457 B1
(45) Date of Patent: Oct. 28, 2003

(54) CMOS TRANSCONDUCTOR CIRCUIT WITH HIGH LINEARITY

(75) Inventor: Chih-Hong Lou, I-Lan (TW)

(73) Assignee: Industrial Technology Research Institute, Hsin-Chu (TW)

( * ) Notice: Subject to any disclaimer, the term of this patent is extended or adjusted under 35 U.S.C. 154(b) by 0 days.

(21) Appl. No.: 10/206,179

(22) Filed: Jul. 29, 2002

(30) Foreign Application Priority Data

May 15, 2002 (TW) ..................................... 091110173 A

(51) Int. Cl.[7] .............................. G06G 7/12; G06G 7/26
(52) U.S. Cl. ...................... 327/560; 327/563; 327/103
(58) Field of Search ................................ 327/103, 560, 327/562, 563, 551, 552

(56) References Cited

U.S. PATENT DOCUMENTS 4,961,046 A * 10/1990 De Jager ..................... 323/315
5,493,205 A * 2/1996 Gorecki ....................... 323/315
5,552,729 A * 9/1996 Deguchi ...................... 327/103
6,005,431 A * 12/1999 Mehr et al. .................. 327/307
6,324,083 B1 * 11/2001 Thus et al. .................... 363/73

* cited by examiner

Primary Examiner—Tuan T. Lam
(74) Attorney, Agent, or Firm—Rosenberg, Klein & Lee

(57) ABSTRACT

The present invention provides a CMOS transconductor circuit that features high frequency with high linearity, and the circuit includes an transistor. The source electrode of this output transistor is for receiving a current source. The gate electrode of this output transistor is for receiving another current source, and the drain electrode of this output transistor is for outputting current. Also included within the present invention is resistance that's coupled to the source electrode of the output transistor. A local negative feedback loop used as a negative feedback to connect the gate electrode of the output transistor to the source electrode itself, which makes the transconductance of this CMOS transconductor circuit to become the reciprocal of the resistance.

12 Claims, 5 Drawing Sheets

CMOS TRANSCONDUCTOR CIRCUIT WITH HIGH LINEARITY

BACKGROUND OF THE INVENTION

1. Field of the Invention

The present invention relates to a transconductor circuit, more particularly to a CMOS transconductor circuit.

2. Description of the Prior Art

Transconductor circuits are the most basic components in transconductor-capacitor filters, or Gm-C filters, with their performances directly affecting those of transconductor-capacitor filters or Gm-C filters. Therefore it is most important to promote the performance of a transconductor circuit, in designing a transconductor-capacitor filter. As normally used in an open loop circuit, a transconductor can't take advantage of negative feedback as general negative feedback closed loop circuits to increase the linearity of the circuit.

As a result of a circuit composed of a transconductor, for example, a Gm-C filter often has a low linearity compared with a negative feedback circuit composed of an amplifier, for example, an active RC filter. Nevertheless, featuring higher frequency operation than that of a closed loop circuit, an open loop circuit such as a transconductor-capacitor filter composed of a transconductor is often used in high frequency (100 MHz range) operations with a low linearity requirement (<50 dBc).

But in low frequency and high linearity operation (1 MHz range, >65 dBc), it is an active RC filter that is preferred. In 10 MHz range and moderate linearity (60 dBc), however, the two structures have their advantages and disadvantages, respectively. As a transconductor-capacitor filter composed of a transconductor in which the linearity of the transconductor determines the linearity of the transconductor-capacitor filter, increasing the linearity of the transconductor becomes first and foremost. Hence it is desirable to present a transconductor circuit with the features of high frequency operation and high linearity.

FIG. 1 shows a transconductor circuit that employs a local feedback loop (refer to: Z. Y. Chang, D. Haspeslagh, and J. Verfaillie, "A highly linear CMOS Gm-C bandpass filter with on-chip frequency tuning, "IEEE JSSC, Vol. 32, No. 3, pp.388–397, March 1997.). As shown in FIG. 1, that a negative feedback loop comprises a differential amplifier 100 and input PMOS transistor 102 so as to create negative feedback connects $V_{XP}$ to $V_{IP}$. In the same way, $V_{XN}$ is connected to $V_{IN}$. As a result, a current $\Delta I$ flows through the resistor with $\Delta I=\Delta V/R=(V_{IP}-V_{IN})/R$. Accordingly, a current $I-\Delta I$ flows through PMOS transistor 102 resulting in a current $-\Delta I=-(V_{IP}-V_{IN})/R=Gm*(V_{IP}-V_{IN})$ on the output, with the transconductance Gm of the transconductor equal to 1/R. It can be seen that the transconductance of the transconductor equals the linear resistance by way of negative feedback loop and is highly linear.

Notwithstanding, the linearity of the Gm-C integrator, as shown in FIG. 1, the transconductor circuit is limited for the sake of the integrated capacitor that is not in the negative feedback loop of the transconductor circuit. Furthermore, the local negative feedback gain of the transconductor circuit is limited to the differential amplifier 100 while the input range of the transconductor circuit is limited to the common mode input range of the differential amplifier 100 with limited gain. Therefore it counts to achieve a higher gain of the differential amplifier 100 to improve the linearity of the transconductor circuit.

SUMMARY OF THE INVENTION

According to the various shortcomings such as low linearity of the traditional transconductor circuits exhibited in the aforesaid background of the invention, it is an object of the present invention to provide a CMOS transconductor circuit with the features of high frequency operation and high linearity.

Further, the CMOS transconductor circuit with high linearity provided in the present invention works steadily in operations of high frequency and high linearity thus, achieving the compatibility of high frequency and high linearity operation, that the well-known transconductor circuits can not offer.

Owing to low linearity and high adaptability in high frequency operation of general transconductor circuits, compared with negative feedback loop circuits composed of amplifiers, transconductor-capacitor filters composed of general transconductors are normally used in high frequency operations without high linearity requirement.

Accordingly, the CMOS transconductor circuit with high linearity provided in the present invention is to utilize a local negative feedback loop in place of a general transconductor circuit using an open loop to achieve the features of high frequency operation and high linearity.

According to the aforesaid object, the present invention provides a CMOS transconductor circuit, which comprises an output transistor, with the gate electrode and the source electrode of the output transistor connected with a second and a first current source as an input respectively and the drain electrode of the output transistor as the output of the current; a resistor, which couples to the source electrode of the output transistor; and a local negative feedback loop which connects the gate electrode of the output transistor to the source electrode of the output transistor to set the transconductance of the CMOS transconductor circuit the equal of the reciprocal of the resistance of the resistor.

Nevertheless the aforesaid local negative feedback loop comprises a first transistor with the source electrode of the first transistor connected to the source electrode of the output transistor; a second transistor with the drain electrode of the second transistor connected to the gate electrode of the output transistor; and a third transistor with the source electrode of the third transistor connected to the ground and the drain electrode of the third transistor connected to the source electrode of the second transistor while the drain electrode of the first transistor connected to the source electrode of the second transistor and the drain electrode of the third transistor at the same time. The present invention further comprises a fourth transistor so as to connect the drain electrode of the first transistor to the drain electrode of the fourth transistor and the gate electrode of the fourth transistor to the gate electrode of the third transistor.

As described above, the CMOS transconductor circuit provided in the present invention utilizes a local negative feedback loop in place of a general transconductor circuit feedback loop to achieve features in high frequency operation requiring high linearity. Further, with features of high frequency operation requiring high linearity, the CMOS transconductor circuit provided in the present invention can be applied to design a CMOS transconductor-capacitor filter with the features of high frequency operation and high linearity.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings wherein.

DESCRIPTION OF THE PREFERRED EMBODIMENT

Some embodiments of the present invention are detailed described as follows. Whereas the present invention may be practiced extensively otherwise than as specifically described herein, it is not desired to limit the present invention to the exact construction and operation illustrated and described, and accordingly all variations and modifications are to be included in the scope of the claims hereafter. For the sake of low linearity and high adaptability in high frequency operation of general transconductor circuits, compared with negative feedback loop circuits composed of amplifiers, transconductor-capacitor filters composed of general transconductors are normally used in high frequency operation without a high linearity requirement.

The CMOS transconductor circuit with high linearity that's provided in the present invention can work steadily in operations of high frequency and high linearity to achieve compatibility that the well-known transconductor circuits can't offer. Accordingly, the CMOS transconductor circuit with high linearity provided in the present invention is to utilize a local negative feedback loop in place of a general transconductor circuit using an open loop to achieve the features of high frequency operation and high linearity.

The present invention provides a CMOS transconductor circuit which comprises an output transistor, with the gate electrode and the source electrode of the output transistor connected with a second and a first current source as input respectively and the drain electrode of the output transistor as output of the current; a resistor, which couples to the source electrode of the output transistor; and a local negative feedback loop which negative feedback connects the gate electrode of the output transistor to the source electrode of the output transistor to set the transconductance of the CMOS transconductor circuit the equal of the reciprocal of the resistance of the resistor.

Nevertheless the aforesaid local negative feedback loop comprises a first transistor with the source electrode of the first transistor connected to the source electrode of the output transistor; a second transistor with the drain electrode of the second transistor connected to the gate electrode of the output transistor; and a third transistor with the source electrode of the third transistor connected to the ground and the drain electrode of the third transistor connected to the source electrode of the second transistor while the drain electrode of the first transistor connected to the source electrode of the second transistor and the drain electrode of the third transistor at the same time. The present invention further comprises a fourth transistor so as to change the drain electrode of the first transistor to be connected to the drain electrode of the fourth transistor, and the gate electrode of the fourth transistor to be connected to the gate electrode of the third transistor.

Figure 2:
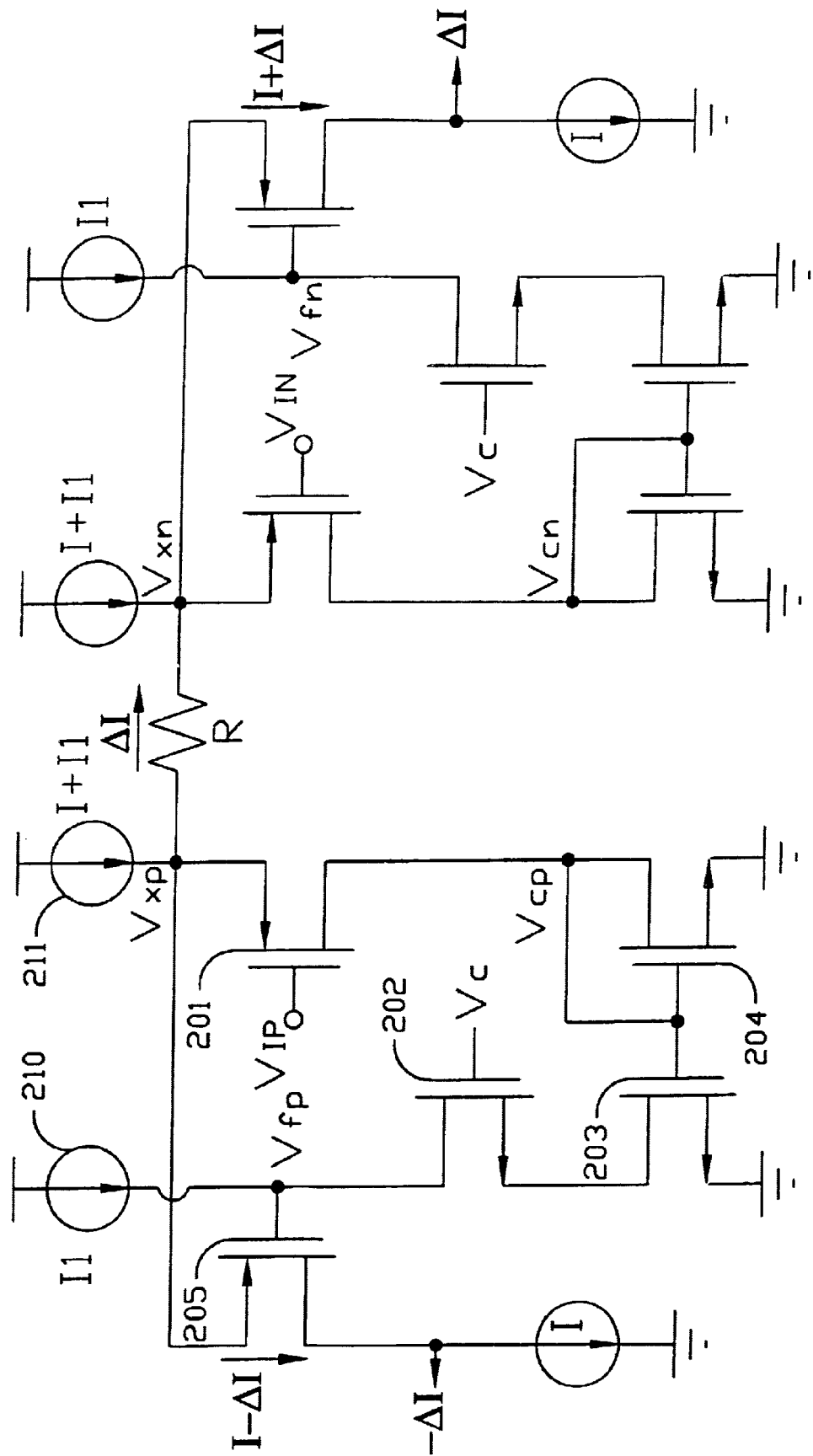
FIG. 2 is to explain a preferred embodiment of the CMOS transconductor circuit provided in the present invention.
Figure 3:
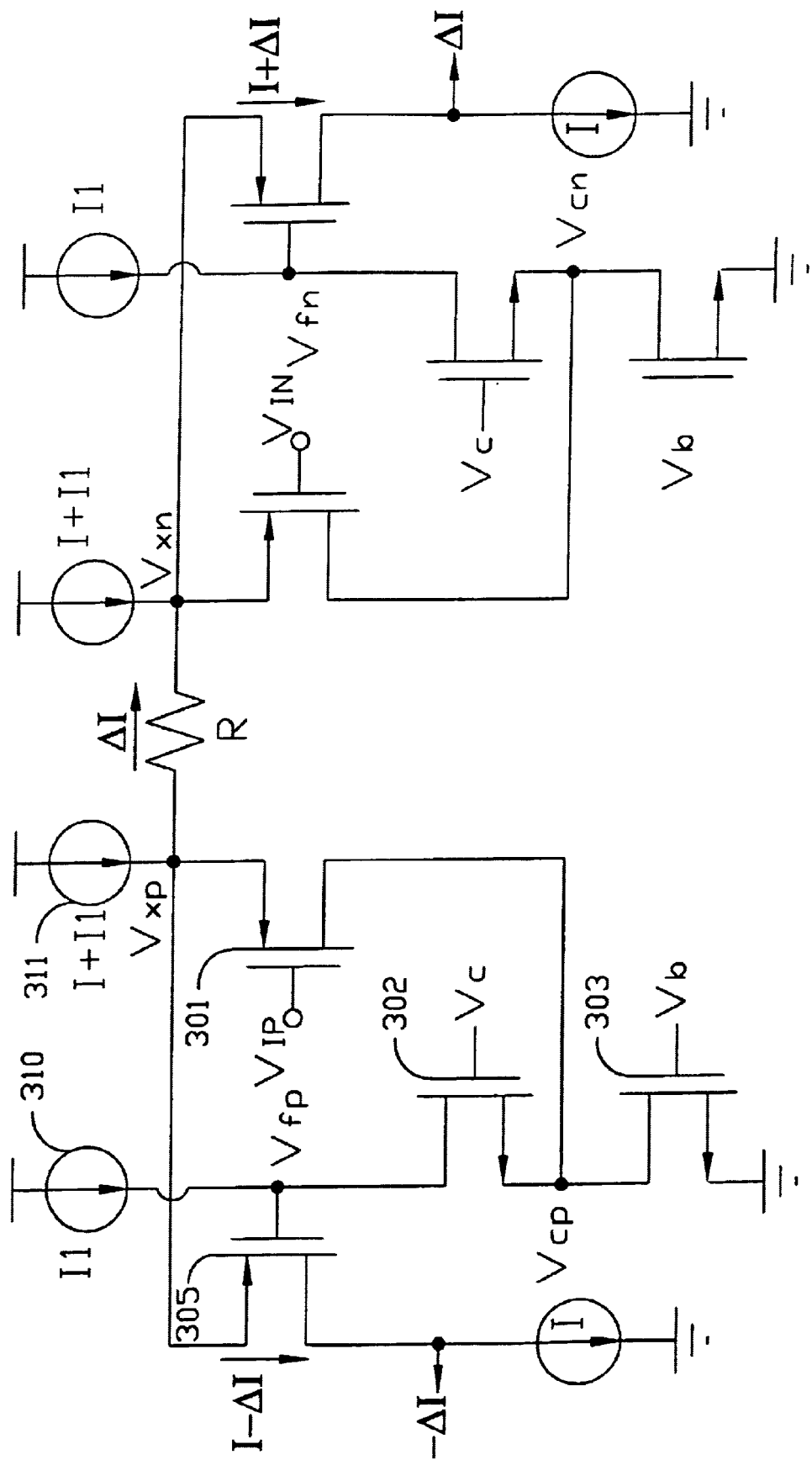

FIG. 2 explains a preferred embodiment of the CMOS transconductor circuit provided in the present invention, and FIG. 3 explains another preferred embodiment of the CMOS transconductor circuit provided in the present invention.

As shown in FIG. 2, wherein the first transistor 201, the second transistor 202, the third transistor 203, the fourth transistor 204, and the first current source 210 comprise a local negative feedback amplifier, which in turn with the output transistor 205 comprise a local negative feedback loop, wherein the drain electrode of the second transistor 202 is connected to the gate electrode of the output transistor 205 and the first current source 210, the source electrode of the third transistor 203 connected to the ground, and the drain electrode of the third transistor 203 connected to the source electrode of the second transistor 202. The source electrode of the fourth transistor 204 is connected to the ground, the gate electrode of the fourth transistor 204 connected to the gate electrode of the third transistor 203, and the drain electrode of the fourth transistor 204 connected to the drain electrode of the first transistor 201 while a jumper short-circuit the drain electrode and the gate electrode of the fourth transistor 204. Therefore, a CMOS differential amplifier circuit is composed by a P-type transistor 201 and three N-type transistors 202, 203 and 204. Further, while the source electrode of the first transistor 201 connects to the source electrode of the output transistor 205, so that the whole connected structure forms a local negative feedback loop.

Figure 4:
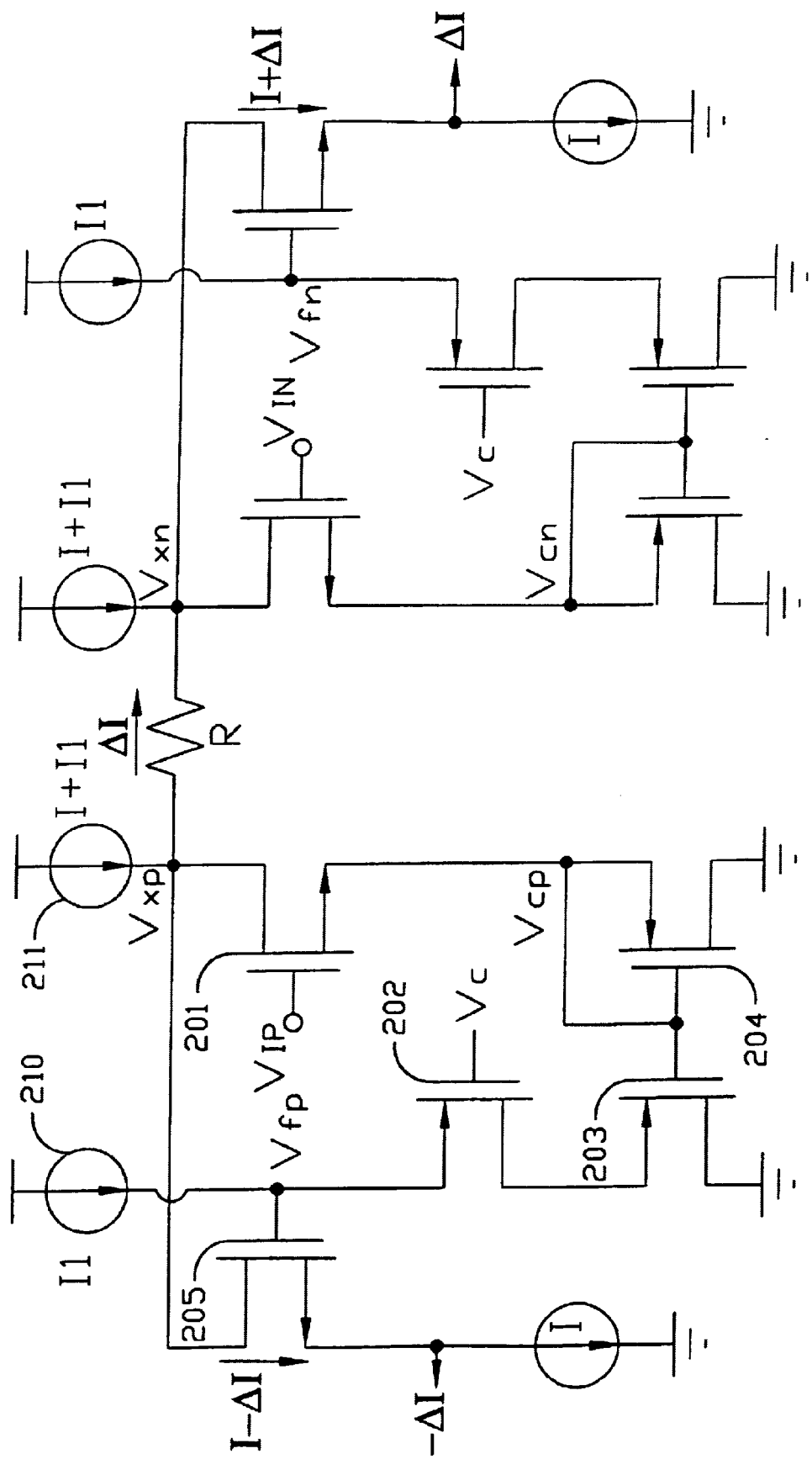
FIG. 4 shows the preferred embodiment of the CMOS transconductor circuit provided in the present invention.

In this preferred embodiment, the first transistor 201 and the output transistor 205 are P-type transistors, while the second transistor 202, the third transistor 203 and the fourth transistor 204 are N-type transistors. Whereas in another embodiment when the first transistor 201 and the output transistor 205 are practiced using N-type transistors, the second transistor 202, the third transistor 203 and the fourth transistor 204 must be practiced using P-type transistors with the action and the principle unchanged, as shown in FIG. 4.

As shown in FIG. 2, wherein the current through the first transistor 201 increases as the input voltage $V_{IP}$ decreases by an amount of $\Delta V$, whereby $V_{CP}$ increases to result in the increase of the current through the third transistor 203 and the drop of $V_{FP}$, whereby the current through the output transistor 205 increases so as to decrease $V_{XP}$, and the whole loop, as a result, is a local negative feedback loop.

Furthermore, when the fourth transistor 204 and the third transistor 203 comprise a current mirror with a ratio 1:1, the current through the first transistor 201 is the first current source 210 at equilibrium (the current through the third transistor 203 at equilibrium is equal to I1, the current through the fourth transistor 204 is equal to that through the third transistor 203, and again the current through the first transistor 201 is equal to that through the fourth transistor 204). Thus the current through the output transistor 205 is equal to I−ΔI, the output current equal to −ΔI, wherein ΔI=ΔV/R, and the transconductance of the transconductor is Gm=1/R.

Thus as shown in FIG. 2, the first transistor 201, the second transistor 202, the third transistor 203, the fourth transistor 204, and the first current source 210 serve as the differential amplifier shown in well-known transconductor circuits, with the difference that the local negative feedback loop in the preferred embodiment of the present invention may easily realize a higher loop gain, and therefore a higher linearity.

Whereas in another preferred embodiment of the present invention as shown in FIG. 3, wherein the drain electrode of the second transistor 302 is connected to the gate electrode of the output transistor 305 and the first current source 310, the source electrode of the third transistor 303 connected to the ground, and the drain electrode of the third transistor 303 connected to the source electrode of the second transistor 302. The source electrode of the first transistor 301 is connected to the source electrode of the output transistor 305, the drain electrode of the first transistor 301 connected to the source electrode of the second transistor 302 and the drain electrode of the third transistor 303.

Figure 5:
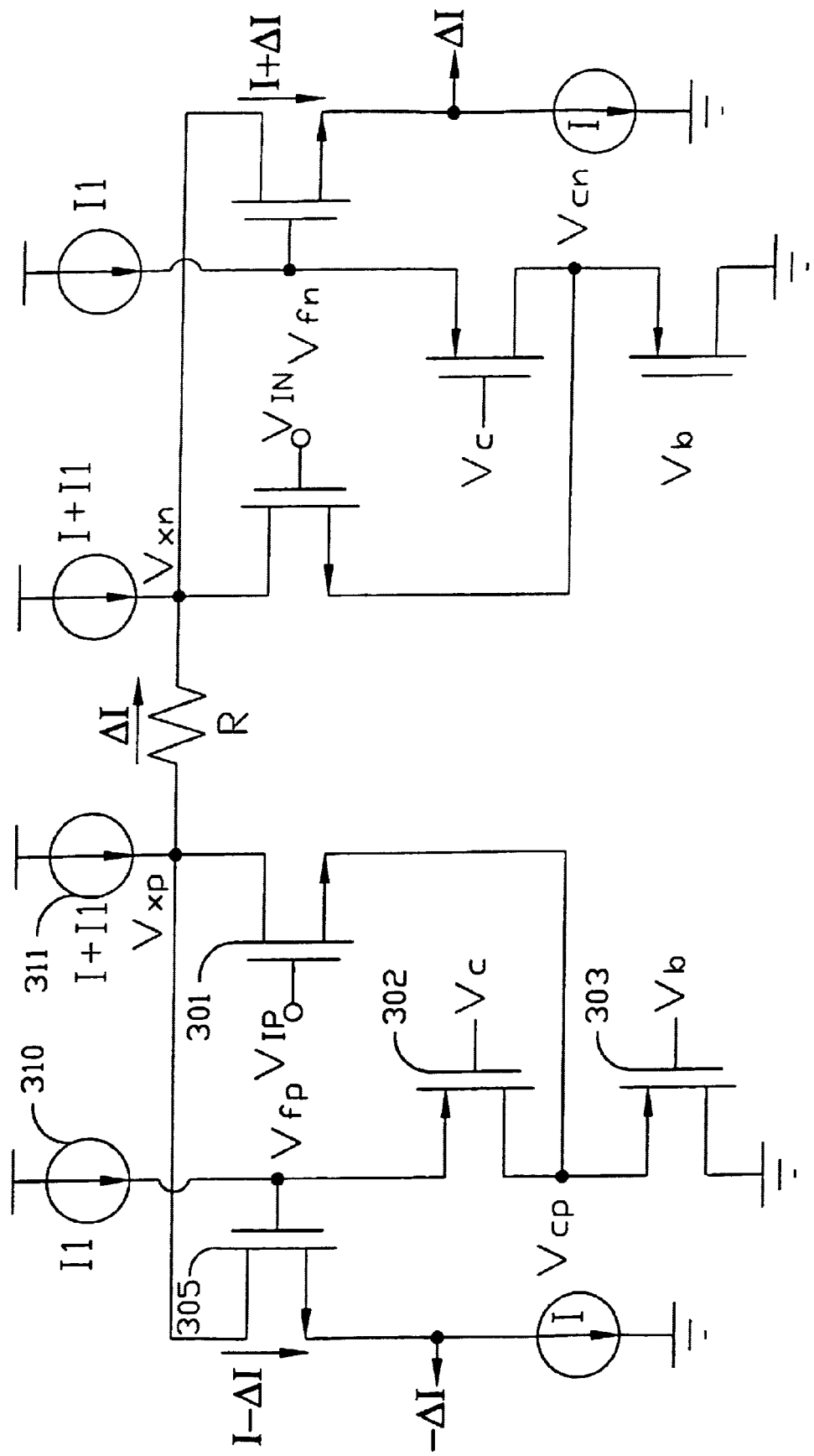
FIG. 5 shows the preferred embodiment of the CMOS transconductor circuit provided in the present invention.

In this preferred embodiment, the first transistor 301 and the output transistor 305 are P-type transistors, while the second transistor 302, and the third transistor 303 are N-type transistors. Whereas in another embodiment when the first transistor 301 and the output transistor 305 are practiced using N-type transistors, the second transistor 302, the third transistor 303 must be a practiced using P-type transistor with the action and the principle unchanged, as shown in FIG. 5.

Wherein the current through the first transistor 301 increases as the input voltage $V_{IP}$ decreases by an amount of $\Delta V$, whereby $V_{CP}$ increases to result in the decrease of the current through the second transistor 302 and the drop of $V_{FP}$, whereby the current through the output transistor 305 increases so as to decrease $V_{XP}$, and the whole loop, as a result, is a local negative feedback loop.

As the circuit shown in FIG. 3 is at equilibrium, the current through the first transistor 301 is I1 provided by the first current source 310, thus the current through the output transistor 305 is equal to I−ΔI, the output current equal to −ΔI, wherein ΔI=ΔV/R, and the transconductance of the transconductor is Gm=1/R.

Figure 1:
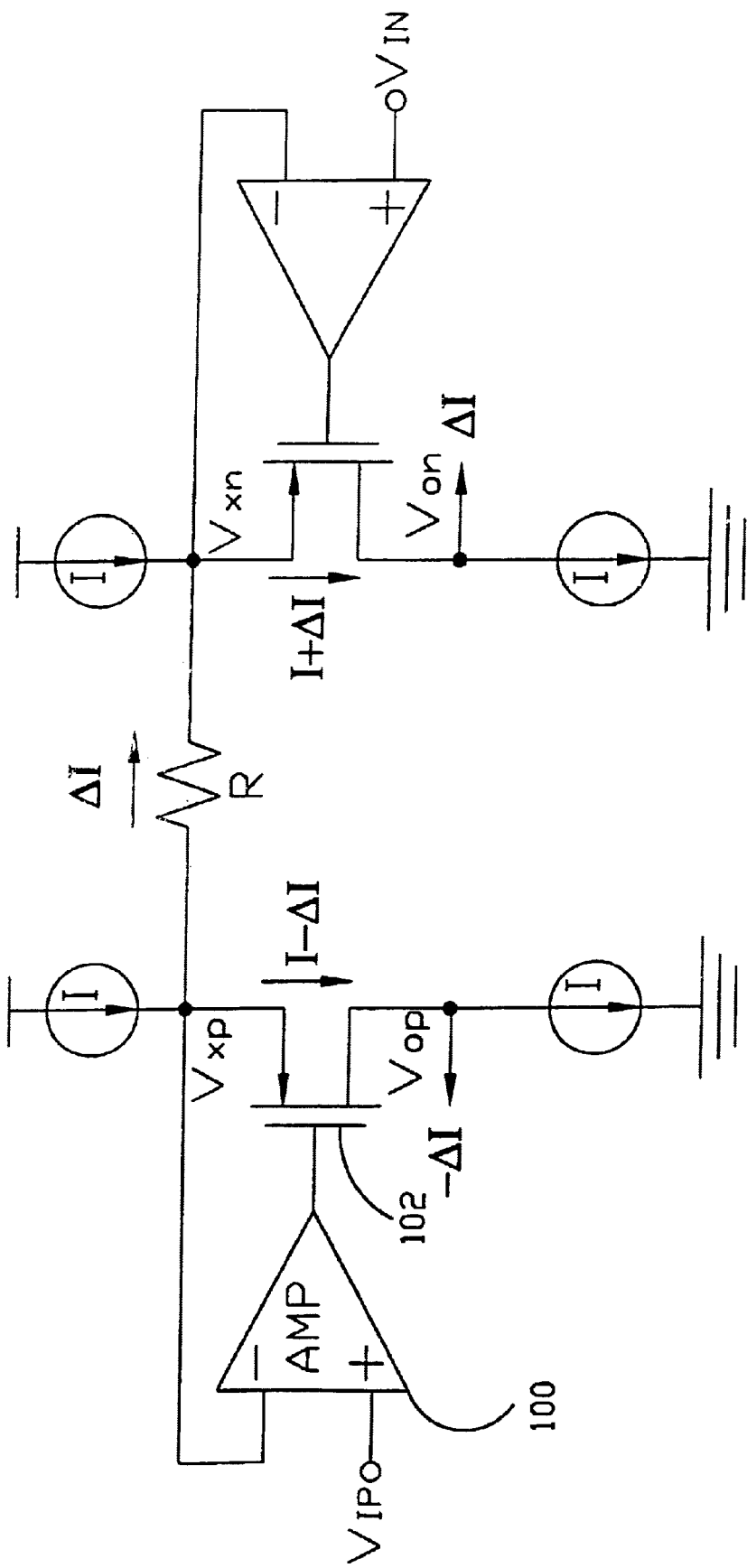
FIG. 1 is to exhibit a well-known transconductor circuit.

Thus as shown in FIG. 3, the first transistor 301, the second transistor 302, the third transistor 303, and the first current source 310 serve as the differential amplifier in the well-known transconductor circuits as shown in FIG. 1, with the difference that the local negative feedback loop in the preferred embodiment of the present invention may easily realize a higher loop gain, and therefore a higher linearity.

As described above, the CMOS transconductor circuit provided in the present invention is to utilize a local negative feedback loop in place of a general transconductor circuit feedback loop to achieve the features of high frequency operation and high linearity. Further, with the features of high frequency operation and high linearity, the CMOS transconductor circuit provided in the present invention can be applied to design a CMOS transconductor-capacitor filter with the features of high frequency operation and high linearity.

Although the invention has been described and illustrated in detail as preferred embodiments, it is to be clearly understood that the same is by way of illustration and example, and is not to be taken by way of limitation, and accordingly all variations and modifications in light of the spirit of the present invention are included within the scope of the appended claims.

What is claimed is:

1. A CMOS transconductor circuit, comprising:
an output transistor, with the gate electrode of said output transistor connected to a first current source as a input, the source electrode of said output transistor connected to a second current source as a input, and the drain electrode of said output transistor as output for outputting current;
a resistor, coupled to said source electrode of said output transistor;
a local negative feedback loop, said local negative feedback connecting said gate electrode of said output transistor to said source electrode of said output transistor, such that the transconductance of said CMOS transconductor circuit is the reciprocal of resistance of said resistor, and said local negative feedback loop comprising:
a first transistor, with the source electrode of said first transistor connected to the source electrode of said output transistor;
a second transistor, with the drain electrode of said second transistor connected to the gate electrode of said output transistor; and
a third transistor, with the source electrode of said third transistor connected to the ground, the drain electrode of said third transistor connected to said source electrode of said second transistor, and said drain electrode of said first transistor connected to said source electrode of said second transistor and said drain electrode of said third transistor at the same time.

2. The CMOS transconductor circuit according to claim 1, wherein said output transistor is a P-type transistor, said first transistor is a P-type transistor, said second transistor is a N-type transistor, and said third transistor is a N-type transistor.

3. The CMOS transconductor circuit according to claim 1, wherein said output transistor is a N-type transistor, said first transistor is a N-type transistor, said second transistor is a P-type transistor, and said third transistor is a P-type transistor.

4. A CMOS transconductor circuit, comprising:
an output transistor, with the gate electrode of said output transistor connected to a first current source as input, the source electrode of said output transistor connected to a second current source as input, and the drain electrode of said output transistor as output of current;
a resistor, coupled to said source electrode of said output transistor;
a first transistor, with the source electrode of said first transistor connected to said source electrode of said output transistor;
a second transistor, with the drain electrode of said second transistor connected to said gate electrode of said output transistor; and
a third transistor, with the source electrode of said third transistor connected to the ground, the drain electrode of said third transistor connected to said source electrode of said second transistor, and said drain electrode of said first transistor connected to said source electrode of said second transistor and said drain electrode of said third transistor.

5. A CMOS transconductor circuit, comprising:
an output transistor, with the gate electrode of said output transistor connected to a first current source as input, the source electrode of said output transistor connected to a second current source as input, and the drain electrode of said output transistor as output of current;
a resistor, coupled to said source electrode of said output transistor;
a first transistor, with the source electrode of said first transistor connected to said source electrode of said output transistor;
a second transistor, with the drain electrode of said second transistor connected to said gate electrode of said output transistor;
a third transistor, with the source electrode of said third transistor connected to the ground, the drain electrode of said third transistor connected to said source electrode of said second transistor; and a fourth transistor, with said source electrode of said fourth transistor connected to the ground, said drain electrode of said first transistor connected to the drain electrode of said fourth transistor, and the gate electrode of said fourth transistor connected to said gate electrode of said third transistor.

6. The CMOS transconductor circuit according to claim 5 further comprising a jumper to short-circuit said drain electrode of said fourth transistor and said gate electrode of said fourth transistor.

7. The CMOS transconductor circuit according to claim 5, wherein said output transistor is a P-type transistor, said first transistor is a P-type transistor, said second transistor is a N-type transistor, said third transistor is a N-type transistor, and said fourth transistor is a N-type transistor.

8. The CMOS transconductor circuit according to claim 5, wherein said output transistor is a N-type transistor, said first transistor is a N-type transistor, said second transistor is a P-type transistor, said third transistor is a P-type transistor, and said fourth transistor is a P-type transistor.

9. A CMOS transconductor circuit, comprising:

an output transistor, with the gate electrode of said output transistor connected to a first current source as a input, the source electrode of said output transistor connected to a second current source as a input, and the drain electrode of said output transistor as output for outputting current;

a resistor, coupled to said source electrode of said output transistor;

a local negative feedback loop, consisting of said output transistor and a CMOS differential amplifier formed by a P-type transistor and three N-type transistors, such that the transconductance of said CMOS transconductor circuit is the reciprocal of resistance of said resistor.

10. The CMOS transconductor circuit according to claim 9, wherein said CMOS differential amplifier comprising:

a first transistor, with the source electrode of said first transistor connected to said source electrode of said output transistor;

a second transistor, with the drain electrode of said second transistor connected to said gate electrode of said output transistor;

a third transistor, with the source electrode of said third transistor connected to the ground, the drain electrode of said third transistor connected to said source electrode of said second transistor; and a fourth transistor, the drain electrode of said fourth transistor connected to the drain electrode of said first transistor, and the gate electrode of said fourth transistor connected to said gate electrode of said third transistor.

11. The CMOS transconductor circuit according to claim 10, further comprising a jumper to short-circuit said drain electrode of said fourth transistor and said gate electrode of said fourth transistor.

12. The CMOS transconductor circuit according to claim 9, wherein said output transistor is a N-type transistor, said first transistor is a N-type transistor, said second transistor is a P-type transistor, said third transistor is a P-type transistor, and said fourth transistor is a P-type transistor.

* * * * *